United States Patent [19]

Yoshida

[11] Patent Number: 5,091,757

[45] Date of Patent: Feb. 25, 1992

[54] SEMICONDUCTOR LIGHT EMITTING ARRAY WITH PARTICULAR SURFACES

[75] Inventor: Tomoaki Yoshida, Natori, Japan

[73] Assignees: Ricoh Company, Ltd., Tokyo; Ricoh Research Institute of General Electronics Co., Ltd., Natori, both of Japan

[21] Appl. No.: 578,348

[22] Filed: Sep. 6, 1990

[30] Foreign Application Priority Data

Sep. 7, 1989 [JP] Japan .................................. 1-230519

[51] Int. Cl.⁵ ............................................ H01L 33/00
[52] U.S. Cl. ........................................ 357/17; 357/16; 357/55; 357/45; 372/48; 372/50; 372/45; 372/46
[58] Field of Search ................ 357/17, 55, 45, 16; 372/48, 50, 45, 46, 43, 49

[56] References Cited

U.S. PATENT DOCUMENTS

| | | | |
|---|---|---|---|
| 4,747,109 | 5/1988 | Tansya et al. | 372/48 |
| 4,768,201 | 8/1988 | Taneya et al. | 372/48 |
| 4,824,747 | 4/1989 | Andrews | 372/48 |
| 4,845,014 | 7/1989 | Ladany | 372/48 |

*Primary Examiner*—William Mintel
*Attorney, Agent, or Firm*—Oblon, Spivak, McClelland, Maier & Neustadt

[57] ABSTRACT

A semiconductor light emitting array device including: a substrate having an upper surface and a lower surface; and a plurality of light emitting elements formed on the substrate in a row and isolated from each other by a separating groove. Each element emits light from a side end surface thereof in a direction parallel to the substrate surface. The groove has a portion formed in a direction other than in parallel to the direction of light in a plan view thereof.

32 Claims, 11 Drawing Sheets

SEMICONDUCTOR LIGHT EMITTING ARRAY WITH PARTICULAR SURFACES

BACKGROUND OF THE INVENTION

1. Field of the Invention

The present invention relates to a semiconductor light emitting array device. More particularly, the invention relates to the semiconductor light emitting array device in which the light emitting area is divided to a plurality of light emitting segments by separating grooves.

2. Description of the Related Art

The semiconductor light emitting array devices have been developed for the purpose of application to a light source of a printer or a copying apparatus using ordinary papers. One of such array devices is a surface light emitting type diode array in which a number of square light emitting segments are disposed along a predetermined line in a plane parallel to the substrate surface. Another array device is a side end light emitting type diode array in which a plurality of optical outputs arranged along a predetermined line are obtained from a side end surface perpendicular to the substrate surface.

An essential structure of the surface light emitting type diode array is disclosed, for example, in a prepublication text 1-211 for all Japan Electronic and Communication Society Symposium Meeting, Communication Branch, 1980. In accordance with the general surface light emitting type diode array, electrodes are formed at the both ends of or around each of the light emitting elements so as to even the optical intensity from the elements throughout the whole area of the light emitting portion of the diode array. Therefore, the electrodes and the light emitting elements are formed on the same plane so that each light emitting segment requires a space for the electrode and the light emitting element plus the element separating area. In accordance with such a structure, it is very difficult to form the light emitting elements in a high density, for example, more than 600 dpi (dots per inch).

Besides, in accordance with such a structure, a large gap is formed between the near field patterns of the light emitting elements. That is, the near field patterns are not continuous in the direction of the horizontal scanning (main scanning) along the row of the light emitting elements. Therefore, though it is possible to continuously scan in the direction of the vertical scanning (subscanning), it is impossible to completely scan along a line in the horizontal scanning direction. As a result, white stripes are formed in the vertical scanning direction in the printed image, which degrades the quality of the print.

An example of the side end light emitting type diode array is disclosed in Japanese Patent Application Laying Open (KOKAI) No. 60-32373. In the published example, a plurality of light emitting elements are formed side by side in a stacked structure formed on the substrate. The light emitting elements are isolated from each other electrically and spatially by separating grooves each of which extends in the direction perpendicular to the light emitting side end surface. In accordance with such a structure, the light emitting element surface and the electrode surface are not formed in the same plane so that the space required for each light emitting segment is a width of the light emitting element plus the element separating groove. Therefore, it is theoretically possible to arrange the light emitting elements in a high density more than 600 dpi. However, also in this case as in the case of the surface light emitting type diode array, mentioned above, a large gap is formed between the adjacent two near field patterns of the light emitting elements since the separating groove is formed along the direction perpendicular to the light emitting side end surface, i.e., parallel to the light emitting direction in a plane parallel to the substrate surface. Therefore, the near field patterns are discontinuous along the direction of light emitting elements row, which impedes the complete line scanning in the horizontal scanning direction, as in the case of the surface light emitting type diode array. Accordingly, the white stripes are still formed in the printed image so that the print quality of the side end light emitting type diode array is still insufficient.

In the above-mentioned side end light emitting type diode array, it has been considered to minimize the width of the element separating groove for the purpose of deletion or minimizing the white stripes generated in the printed image along the vertical scanning direction. The groove is formed from the layer-stacked structure surface through the active layer of the light emitting area to the substrate. The light emitting area is formed 2 to 50 μm deep from the surface of the layer-stacked structure according to the light emission efficiency. Therefore, if the groove to be formed as narrow as 1 to 2 μm wide to avoid the degradation of the print quality, the aspect ratio (depth/width) of the groove section becomes up to 1 to 50. It is technically very difficult to accurately form such a groove having a large aspect ratio. Besides, even if it becomes possible to form such a narrow groove in the stacked structure, it is still impossible to completely delete the white stripes along the vertical scanning direction in the printed image since the groove is still exists, even if very thin, between the light emitting elements, which forms the gap between the adjacent near field patterns of the light emitting elements.

For the reasons mentioned above, it has not been achieved to realize a semiconductor light emitting array device for a printing apparatus which makes it possible to obtain a print image of high density and high quality.

SUMMARY OF THE INVENTION

It is therefore an object of the present invention to provide a semiconductor light emitting array device for printing an image which device obviates the above-mentioned problems of the related art and makes it possible to fully minimize or completely delete the gap between the near field patterns of the adjacent light emitting elements, which enables to scan along a line in the horizontal scanning direction without generating blank portions on the scanning line, thus realizing a printing image of high density and high quality.

The above-mentioned object of the present invention can be achieved by a semiconductor light emitting array device comprising:

a substrate having an upper surface and a lower surface; and a plurality of light emitting elements formed on said substrate in a row and isolated from each other by a separating groove, each element emitting light from a side end surface thereof in a direction parallel to said substrate surface, and said groove having a portion formed in a direction other than in parallel to said direction of light in a plan view thereof.

The present invention is applied to the structure for printing in which, unlike the electrostatic recording means or the thermal recording means, an optical system such as a short focal length lens array device is disposed between the semiconductor light emitting array device and the light irradiation surface of the photoconductor drum so that images of near field patterns of the light emitting elements are formed on the light irradiation surface to print images and in which the optical system has a focal depth which is longer than the length of the light emitting element.

In accordance with the structure of the present invention, mentioned above, which is improved from the side end light emitting type diode array device, the light emitting area is divided by separating grooves each of which has a portion not parallel to the light emission direction so that the output light of the array device includes the light emitted from the groove side wall of the portion not parallel to the light emission direction in addition to the light emitted from the light emitting elements. As a result, near field patterns of the optical output from the groove side walls are formed between the near field patterns of the light emitting elements, which reduces the gap between the near field patterns of the light emitting elements so that the gap becomes narrower than the actual width of the separating groove.

Besides, by minimizing or deleting the gap between the near field patterns, it becomes possible to make the near field patterns continuous.

Also, by an arrangement in which the groove has a portion not parallel to the light emission direction and a portion parallel to the light emission direction as well, it becomes possible to control the gap between the adjacent near field patterns to reduce the width thereof or delete it and increase the optical output of the device as well.

An advantage of the present invention is that it becomes possible to minimize or delete the gap between the adjacent printing dots along the horizontal scanning direction, which remarkably upgrades the printing quality, when used as a light source for a printer, due to the structure in which each of the separating grooves for isolating each of the light emitting segments is arranged in such a way that the groove has a portion not parallel to the light emission direction so that the near field patterns of the groove side wall are formed between those of the light emitting elements.

Further objects and advantages of the present invention will be apparent from the following description of the preferred embodiments of the invention as illustrated in the accompanying drawings.

BRIEF DESCRIPTION OF THE DRAWINGS

FIG. 1b is an explanatory view of the near field pattern image obtained by the diode array device of FIG. 1a;

FIG. 2b is an explanatory view of the near field pattern image obtained by the diode array device of FIG. 2a;

FIG. 3b is an upper view of the embodiment of FIG. 3a;

FIG. 5b is an upper view of the embodiment of FIG. 5a;

FIG. 7b is an upper view of the embodiment of FIG. 7a;

FIG. 9b is an upper view of the embodiment of FIG. 9a;

FIG. 11b is an upper view of the embodiment of FIG. 11a;

FIG. 12b is an upper view of the embodiment of FIG. 12a;

FIG. 13b is an upper view of the embodiment of FIG. 13a;

FIG. 14b is an upper view of the embodiment of FIG. 14a;

FIG. 16b is an upper view of the embodiment of FIG. 16a;

FIG. 18b is an upper view of the embodiment of FIG. 18a; and

DESCRIPTION OF THE PREFERRED EMBODIMENTS

Figure 1A:
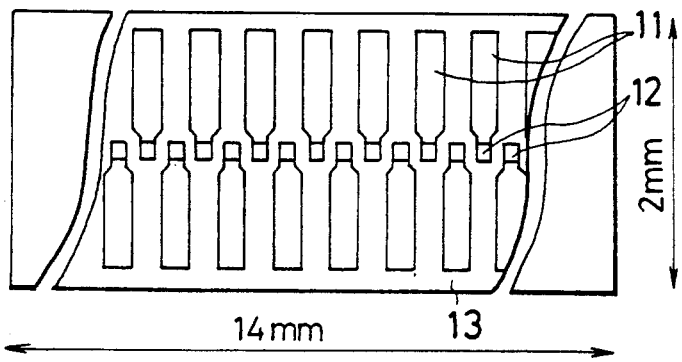
FIG. 1a is a plan view of a surface light emitting type diode array in accordance with the related art.

Embodiments of the present invention are described hereinafter in detail with reference to the drawings and in comparison to the related art which is also illustrated in the drawings.

Examples of the light emitting diode array structure relating to the present invention are illustrated in FIGS. 1 and 2. The present invention is improved from the related art structure illustrated in FIGS. 1 and 2.

FIG. 1a illustrates an essential structure of a surface light emitting type diode array.

In accordance with the surface light emitting type diode array, electrodes 11 are formed at the both ends of or around each of the light emitting elements 12 so as to even the optical intensity from the elements 12 throughout the whole area of the light emitting portion of the diode array. Therefore, the electrodes 11 and the light emitting elements 12 are formed on the same plane so that each light emitting segment requires a space for the electrode 11 and the light emitting element 12 plus a space for the element separating area. In accordance with such a structure, it is very difficult to form the light emitting elements 12 in a high density, for example, more than 600 dpi (dots per inch).

Figure 1B:
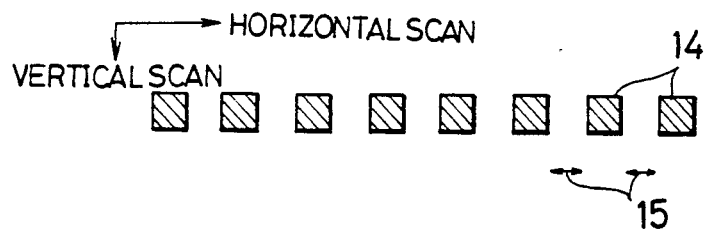

Besides, in accordance with such a structure, a large gap 15 is formed between the near field patterns 14 of the light emitting elements 12, as illustrated in FIG. 1b. That is, the near field patterns 14 are not continuous in the direction of the horizontal scanning (main scanning) along the row of the light emitting elements 12. Therefore, though it is possible to continuously scan in the direction of the vertical scanning (subscanning), it is impossible to completely scan along a line in the horizontal scanning direction. As a result, white stripes are formed in the vertical scanning direction in the printed image, which degrades the quality of the print.

Figure 2A:
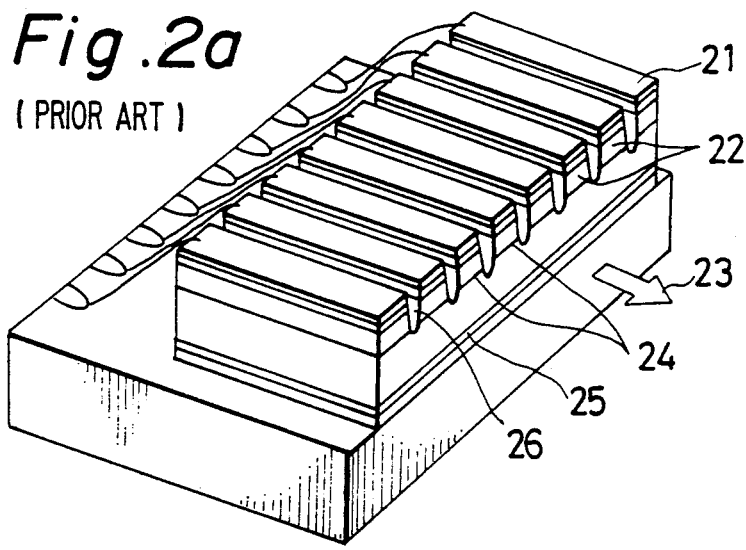
FIG. 2a is a perspective view of a side end light emitting type diode array in accordance with the related art.

FIG. 2a illustrates an example of the side end light emitting type diode array.

Figure 2B:
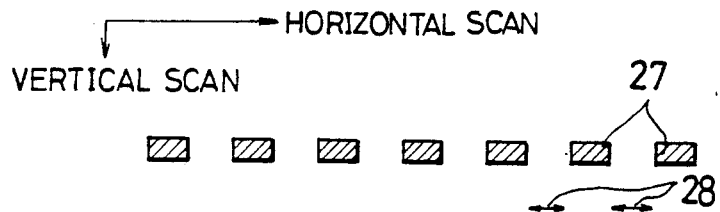

In this example, a plurality of light emitting elements 24 are formed side by side in a stacked structure formed on the substrate. The light emitting elements 24 are isolated from each other electrically and spatially by separating grooves 26 each of which is extends in the direction perpendicular to the light emitting side end surface. In accordance with such a structure, the surface of the light emitting element 24 and the surface of the electrode 21 are not formed in a same plane so that the space required for each light emitting segment is a width of the light emitting element 24 plus the element separating groove. Therefore, it is theoretically possible to arrange the light emitting elements 24 in a high density more than 600 dpi. However, also in this case as in the case of the surface light emitting type diode array of FIGS. 1a and 1b, mentioned above, a large gap 28 is formed between the adjacent two near field patterns 27 of the light emitting elements, as illustrated in FIG. 2b, since the separating groove 26 is formed along the direction perpendicular to the surface of the light emitting side end 22, i.e., parallel to the light emitting direction in a plane parallel to the substrate surface. Therefore, the near field patterns are discontinuous along the direction of the row of the light emitting elements 24, which impedes the complete line scanning in the horizontal scanning direction, as in the case of the surface light emitting type diode array of FIGS. 1a and 1b. Accordingly, the white stripes are still formed in the printed image so that the print quality of the side end light emitting type diode array is still insufficient.

In the above-mentioned side end light emitting type diode array, it has been considered to minimize the width of the element separating groove 26 for the purpose of deletion or minimizing the white stripes generated in the printed image along the vertical scanning direction. The groove 26 is formed from the stacked-layer structure surface through the active layer of the light emitting area to the substrate. The light emitting area is formed 2 to 5 $\mu$m deep from the surface of the stacked-layer structure according to the light emission efficiency. Therefore, if the groove 26 is to be formed as narrow as 1 to 2 $\mu$m wide to avoid the degradation of the print quality, the aspect ratio (depth/width) of the groove section becomes up to 1 to 50. It is technically very difficult to accurately form such a groove having a large aspect ratio. Besides, even if it becomes possible to form such a form groove 26 in the stacked structure, it is still impossible to completely delete the white stripes along the vertical scanning direction in the printed image since the groove 26 is still exists, even if very thin, between the light emitting elements 24, which forms the gap between the adjacent near field patterns of the light emitting elements 24.

The embodiments of the present invention described below obviate the problems, mentioned above.

Figure 3A:
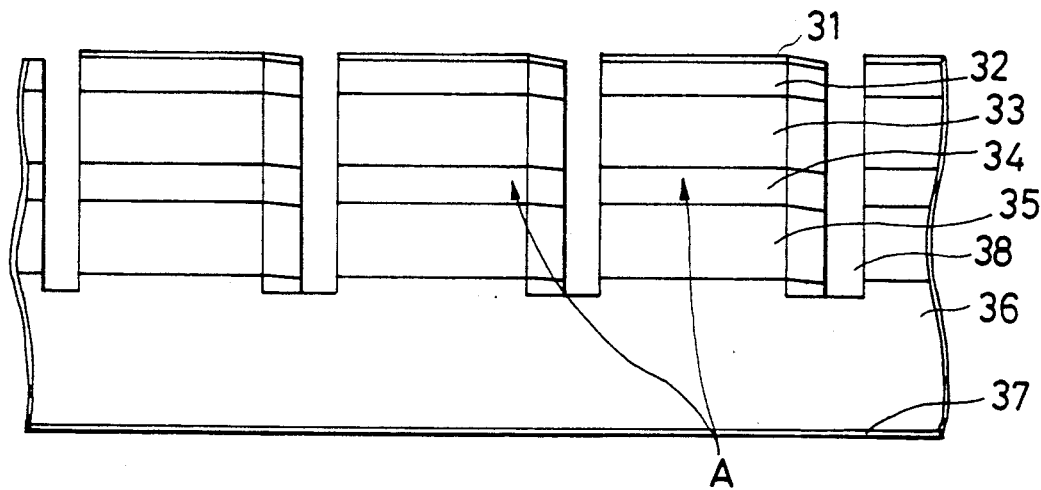
FIG. 3a is a front view of an embodiment of the semiconductor light emitting array device in accordance with the present invention.
Figure 3B:
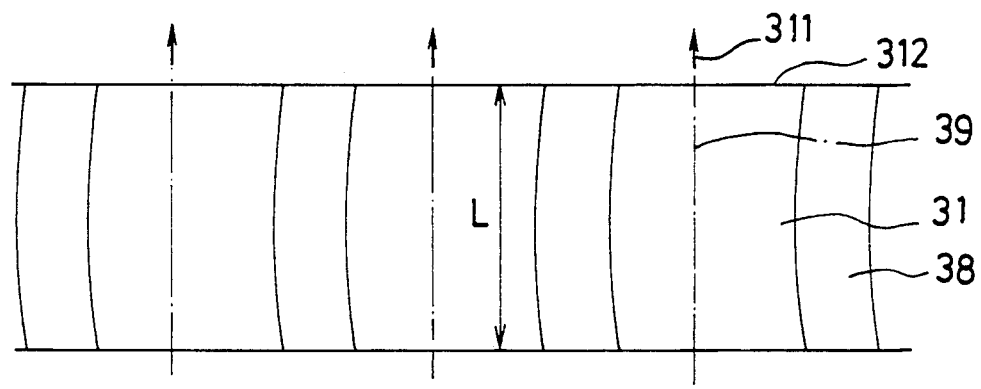

FIGS. 3a and 3b illustrate a first embodiment of the semiconductor light emitting array device in accordance with the present invention. FIG. 3a illustrates a front view of the device seen from the side end surface from which the light is output.

The array device comprises a layer-stacked structure (double-hetero structure) including a first electrically conductive substrate 36, a first electrically conductive clad layer 35, a light emitting active layer 34, a second electrically conductive clad layer 33 and a cap layer 32.

Separating grooves 38 are arranged to electrically divide the stacked structure to a plurality of light emitting segments. Each groove 38 is formed from the upper surface of the stacked structure, i.e., the upper surface of the cap layer 32 to the surface of the substrate 36 in the direction perpendicular to the substrate surface. The array device is an assembly of the light emitting elements, each being constituted from the isolated light emitting segment divided by the grooves 38.

In FIG. 3a, reference letter (A) designates adjacent two light emitting elements.

The light emitting side end surface is formed perpendicular to the surface of the substrate 36. On the cap layer 32 of each light emitting element is formed an electrode 31 corresponding to the second electrically conductive type layer. Also, in the lower surface of the substrate 36 is formed an electrode 37 corresponding to the first electrically conductive type layer. An optical output can be obtained from a desired light emitting element within the array device by running a predetermined forward current between the second electrically conductive electrode 31 and the first electrically conductive electrode 37 of the desired light emitting element.

As illustrated in FIG. 3b, the groove 38 is formed from one side end surface of the stacked structure of the other side end surface thereof so that it has a portion not parallel to the optical axis 39 of the light emission of the subsbrate surface.

As can be seen from FIG. 3b, the groove 38 is formed as an circular arc so that it includes a portion not parallel to the light emission axis 39.

In accordance with the above-mentioned structure, since the groove 38 formed between the adjacent light emitting elements is not parallel to the light emission axis 39, the light emitted from the side surface of the groove 38 is also included in the optical output 311 in the direction of the light emission axis 39 in addition to the light emitted from the side ene surface 312 when the element is activated.

In the event that the optical system for forming an image has a focal depth which is equal to or larger than the length of the light emitting element, the light emitted from the side wall of the groove 38 also forms an image on the image surface as near field pattern image in addition to the image from the side end surface 312.

Figure 4:
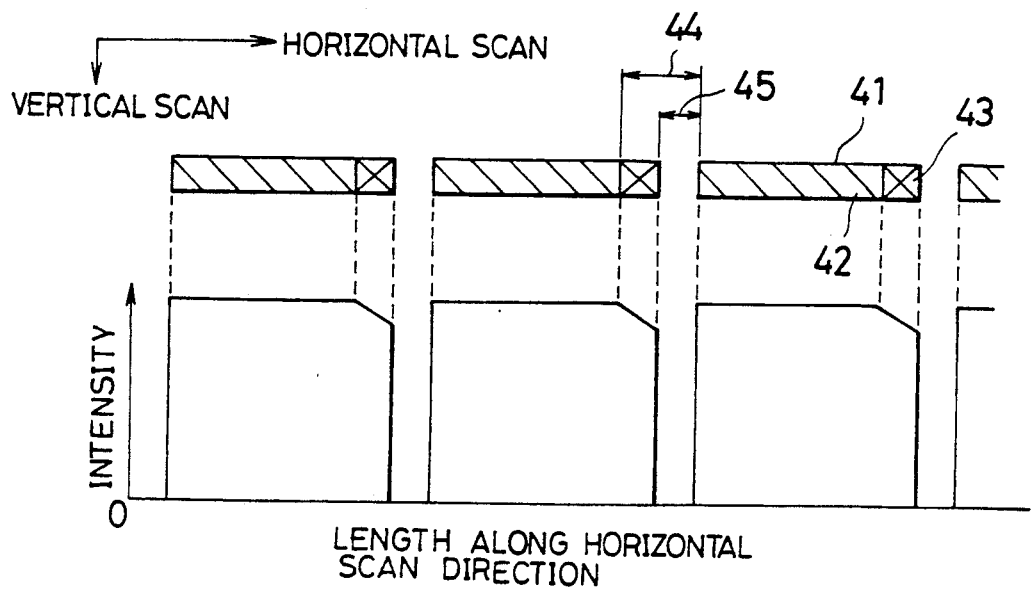
FIG. 4 is an explanatory view of the near field pattern image and the optical intensity distribution in accordance with the embodiment of FIGS. 3a and 3b.

FIG. 4 illustrates the near field patterns formed by the array device of FIGS. 3a and 3b and the optical intensity distribution of the light emitted from the device.

As can be seen from the drawing, between the adjacent near field pattens 42 of the light emission side ends is formed a near field pattern 43 of the side wall of the groove 38 having a desired width. Therefore, the gap 45 between the adjacent near field patterns 41 of the adjacent light emitting elements becomes smaller than the actual width 44 of the groove 38.

In the event that the array device having the above-mentioned near field patterns is used as a light source for a printer, it becomes possible to extremely reduce the gap 45 between dots along the scanning line in the horizontal scanning direction which results in upgrading of the printing quality.

Figure 5A:
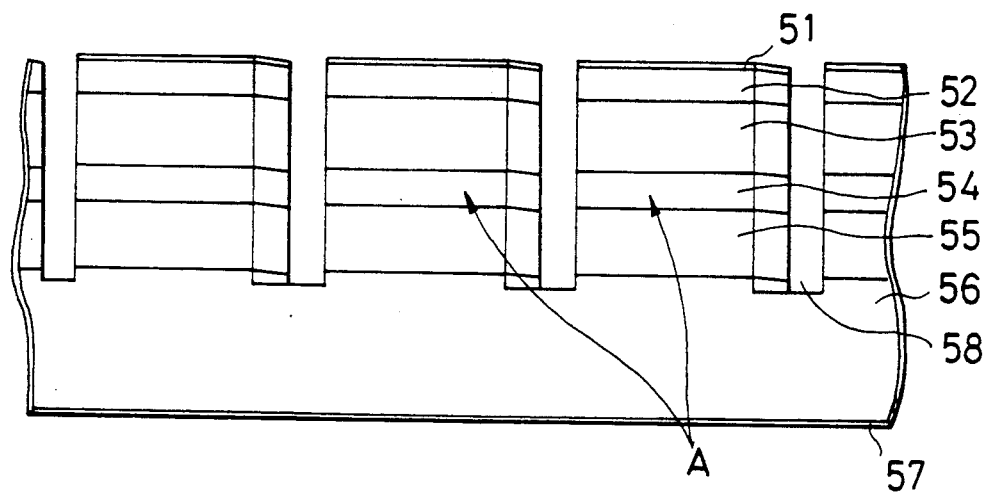
FIG. 5a is a front view of another embodiment of the semiconductor light emitting array device in accordance with the present invention.
Figure 5B:
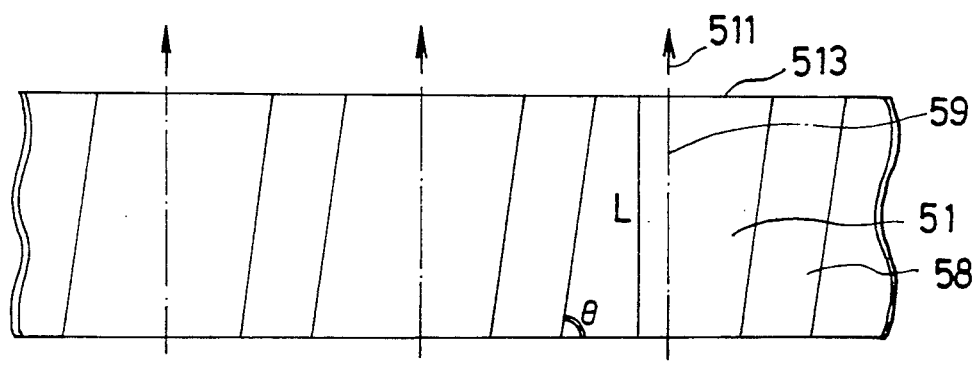

FIGS. 5a and 5b illustrate a second embodiment of the present invention. FIG. 5a illustrates the array device seen from the front side thereof from which the light is emitted.

The array device of the second embodiment comprises a layer-stacked structure (double-hetero structure) including a first electrically conductive substrate 56, a first electrically conductive clad layer 55, a light emitting active layer 54, a second electrically conductive clad layer 53 and a cap layer 52.

A separating groove 58 is formed in the layer-stacked structure from the upper surface thereof, i.e., the upper surface of the cap layer 52 to the substrate 56 in the direction perpendicular to the surface of the substrate 56. The grooves 58 divide the array structure into a plurality of light emitting elements which are electrically isolated from each other. The array device is an assembly of the light emitting segments composed of the light emitting elements. The light emitting side end 513 (FIG. 5b) of the array device is perpendicular to the surface of the substrate 56.

On each cap layer 52 of each light emitting element is formed an electrode 51 corresponding to the second electrically conductive type layer. Also, on the lower surface of the first electrically conductive substrate 56 is formed an electrode 57 corresponding to the first electrically conductive type layer.

An optical output cna be obtained from any desired light emitting element in the array device by running a predetermined forward current between the second electrically conductive electrode 51 and the first electrically conductive electrode 57 of the desired light emitting element.

As illustrated in FIG. 5b, the separating groove 58 of the array device is formed linearly from one side end surface to the other side end surface in a direction not parallel to the light emission axis 59 on the surface of the substrate 56, that is, in a direction of angle $\theta$ which is other than 90 degrees with respect to the light emitting side end surface, i.e., in a direction not perpendicular to the side end surface.

In accordance with the above-mentioned array device structure, when the light emitting element is activated, the optical output emitted in the direction of the emission axis 59 includes the light emitted from the side wall of the groove 58 in addition to the light 511 emitted from the side end surface 513, since the separating groove 58 formed between the adjacent light emitting elements is not parallel to the light emission axis 59.

Figure 6:
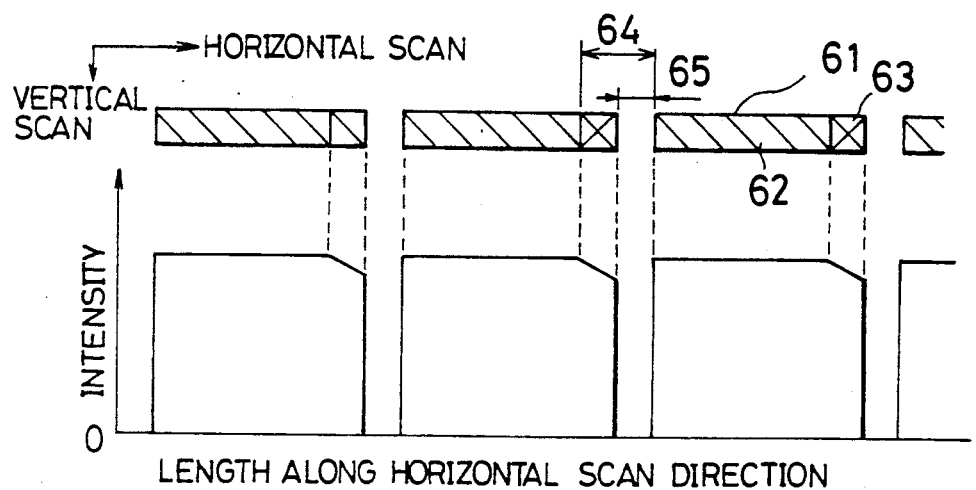
FIG. 6 is an explanatory view of the near field pattern image and the optical intensity distribution in accordance with the embodimdent of FIGS. 5a and 5b.

In the event that the optical system for forming images has a focal depth which is equal to or larger than the length L of the light emitting element, the near field apparatus of the light emitted from the side walls of the grooves 58 are also formed on the image surface, as illustrated in FIG. 6. That is, near field patterns 63 of the side wall of the groove 58 are formed between the near field patterns 62 of the light emitting end surface 513. Accordingly, the gap 65 between the near field patterns of the adjacent light emitting elements becomes smaller than the width 64 of the groove 58.

Besides, since the groove 58 is formed linearly on the surface of the substrate 56, by changing the angle $\theta$ between the groove direction and the element end surface 513, it becomes possible to control and change the width of the near field pattern of the side wall of the groove 58 formed between the near field pattern images of the element end surface 513. As a result, the gap between the adjacent elements is accurately controlled to be reduced to a desired width.

FIG. 6 illustrates an example of the near field patterns adn the optical intensity of the light emitting array device of the above-mentioned structure illustrated in FIGS. 5a and 5b.

By adopting the light emitting array device having the near field patterns 61 as a light source for a printer, it becomes possible to easily and accurately minimize the gap between dots along the horizontal scanning line, which remarkably upgrades the quality of the print.

As mentioned above, in accordance with the second embodiment of the present invention, the separating grooves for isolating the light emitting elements are formed linearly on the substrate along the direction not parallel to the light emission axis, so that a near field pattern of the side wall of the above is formed between the near field patterns of the light emitting end surface. Therefore, in the event that the array device is used as a light source of a printer, when in the horizontal scanning operation along a line of array, it becomes possible toi minimize the gap between dots to an extent which could not be achieved by the prior art structure, which remarkably upgrades the quality of the print.

Also, in accordance with the above-mentioned structure of the light emitting array device, the separating groove is formed linearly, which makes the structure simple and easy to produce. Besides, by changing the angle of the linear groove with respect to the light emission axis, it becomes possible to adjust the gap between dots accurately and reproducibly.

Figure 7A:
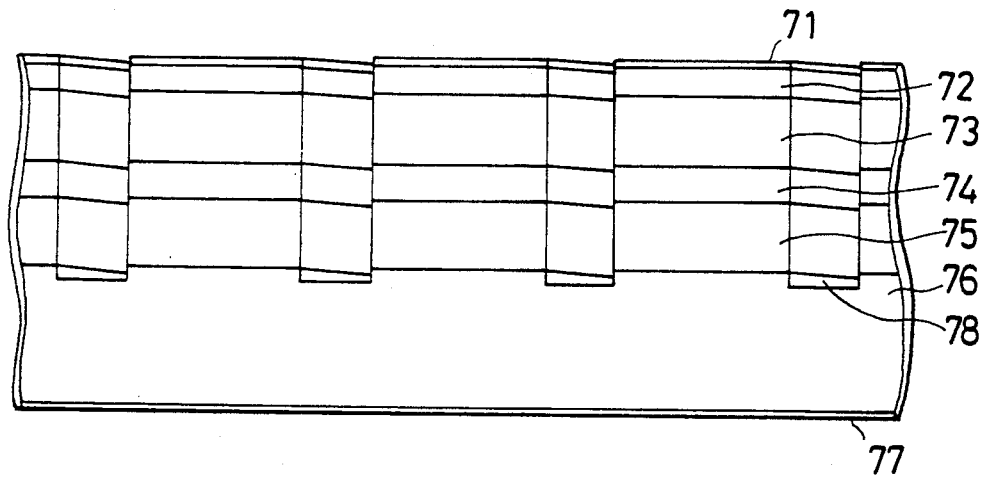
FIG. 7a is a front view of still another embodiment of the semiconductor light emitting array device in accordance with the present invention.
Figure 7B:
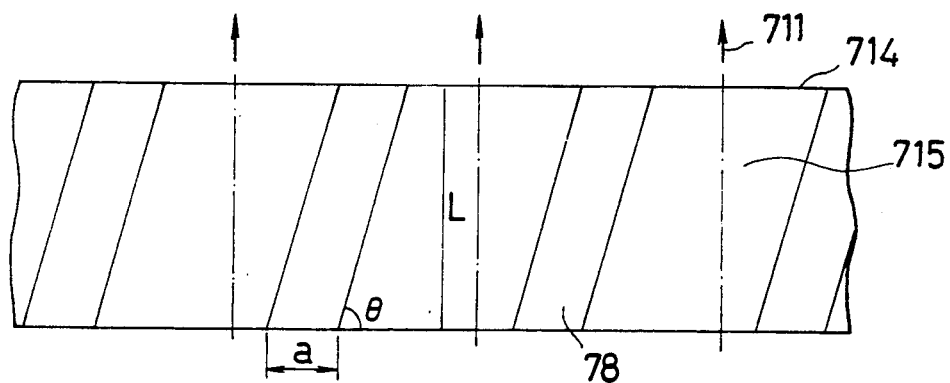

FIGS. 7a and 7b represent a third embodiment of the semiconductor light emitting array device in accordance with the present invention.

FIG. 7a illustrates a front view of the third embodiment of the array device. As illustrated in the drawing, the array device comprises a layer-stacked structure similar to that of the first and second embodiments illustrated in FIGS. 3a, 3b and 5a, 5b, respectively, in which separation grooves 78 are formed in the stacked structure from the surface thereof to the surface of the substrate 76 which is a first electrically conductive type layer. The adjacent two light emitting elements are electrically isolated from each other by the groove 78. The array device is an assembly of a plurality of the light emitting elements.

In this embodiment, as illustrated in FIG. 7b, the groove 78 is formed in a direction not parallel to the light emission axis 715 on the surface of the substrate 76, that is, the angle θ of the groove with respect to the light emitting end surface 714 is other than 90 degrees. Also, the groove 78 satisfies a condition tan $\theta \leq L/a$ wherein letter (a) represents the width of the groove 78 in the end surface 714 and letter (L) represents the length of the light emitting element. The groove 78 is formed linearly from one side end surface of the stacked structure to the other side end surface.

Figure 8:
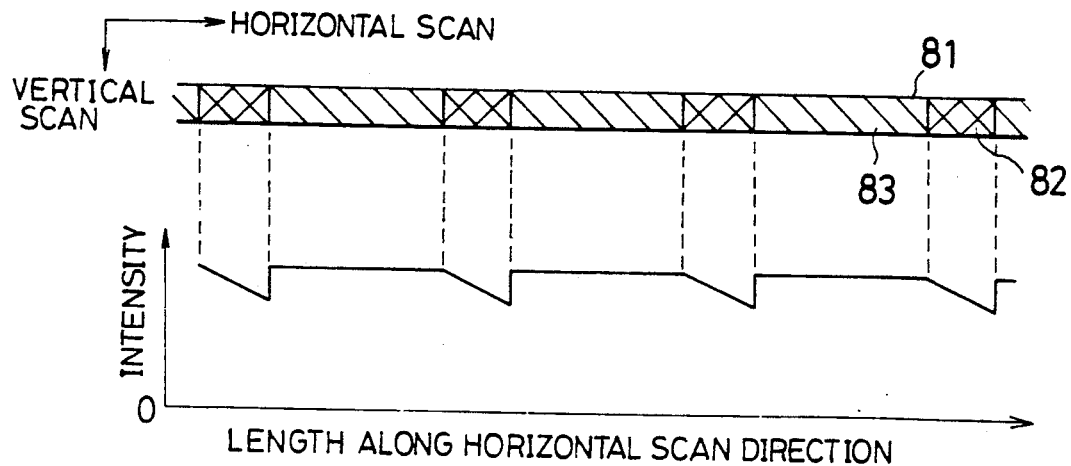
FIG. 8 is an explanatory view of the near field pattern image and the optical intensity distribution in accordance with the embodiment of FIGS. 7a and 7b.

In the event that the light emitting array device having the above-mentioned structure is used in conjunction with an optical system having a focal depth larger than (a tanθ), as illustrated in FIG. 8, near field patterns 82 of the side walls of grooves 78 are formed on the image surface so that the gap between adjacent two near field patterns 83 of the light emitting end surface is filled with the image 82 of the groove side wall. Therefore, the near field patterns 81 of the light emitting elements become continuous. In this case, an example of the optical intensity distribution is represented in FIG. 8.

In the event that the light emitting array device having the above-mentioned structure is used as a light source of a printer, the dots become continuous not only in the vertical scanning direction but the horizontal scanning direction as well so that a complete line scanning can be achieved in both scanning direction, which remarkably upgrades the quality of the print.

In accordance with the embodiment mentioned above, the groove 78 for isolating each light emitting element is formed on the substrate linearly in a direction not parallel to the light emission axis 713 wherein the angle θ of the groove with respect to the light emitting end surface 714 in a plane parallel to the substrate surface satisfies the condition tan $\theta \leq L/a$ wherein letter (a) represents the width of the groove in the light emitting end surface 714 and letter (L) represents the length of the light emitting element.

Due to the featured structure mentioned above, a near field pattern of the side wall of the groove 78 is formed between every two adjacent near field patterns of the light emitting end surface so that the entire gap between adjacent near field patterns of the light emitting end surface is covered with the near field pattern of the groove wall.

In the event that the light emitting array device having the feature mentioned above is used as a light source of a printer, it becomes possible to obtain a continuous scanning line not only in the vertical scanning direction but also in the horizontal scanning direction as well, which was not possible according to the prior art. Therefore, printing products of high grade is quality can be obtained.

Besides, the groove of the array device of the invention is formed linearly, which makes the device easy to produce without making the structure complicated.

Figure 9A:
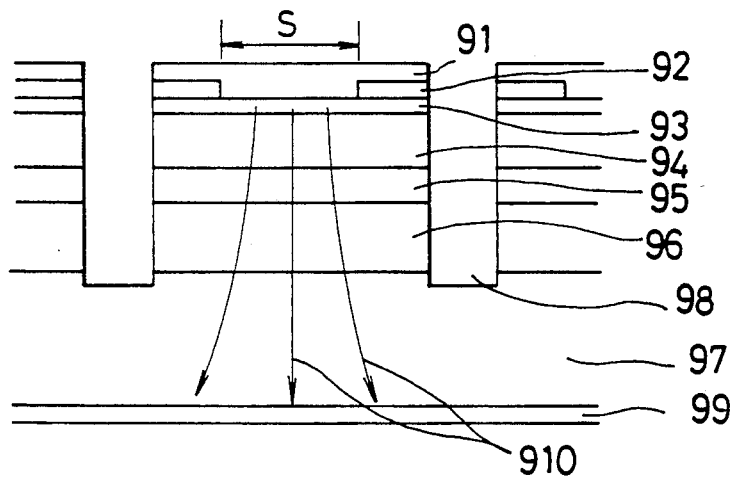
FIG. 9a is a front view of still another embodiment of the semiconductor light emitting array device in accordance with the present invention.
Figure 9B:
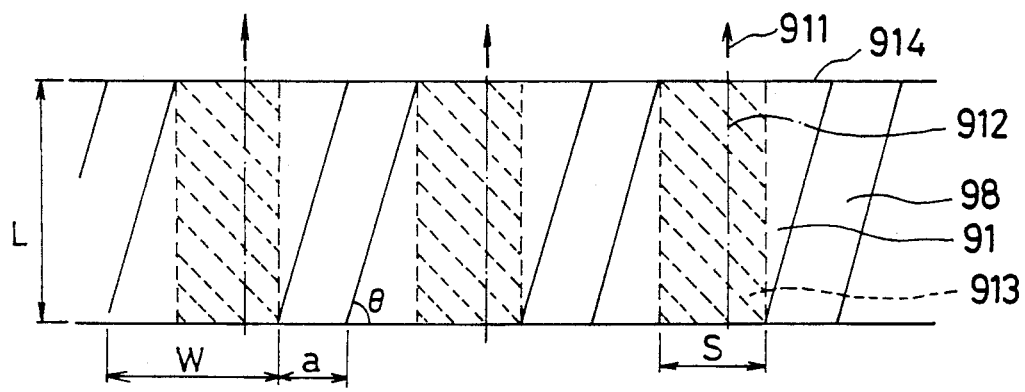

FIGS. 9a and 9b represent a fourth embodiment of the light emitting semiconductor array device in accordance with the present invention. As illustrated in FIG. 9a, the embodiment comprises a layer-stacked structure similar to that of the first to third embodiments, mentioned before, in which separating grooves 98 are formed in the stacked structure from the surface thereof to the first electrically conductive substrate 97 along the direction perpendicular to the surface of the substrate 97. The grooves 98 electrically isolate each light emitting element, as in the case of the preceding embodiments. The array device is an assembly of a plurality of the isolated light emitting elements.

As illustrated in FIG. 9b, each groove 98 is formed from one side end surface of the stacked structure to the other side end surface along a direction not parallel to the light emission axis 912 on the surface of the substrate 97.

As illustrated in FIGS. 9a and 9b, an electrically insulating film 92 is disposed on the cap layer 93, covering the portion other than the current route on the layer 93. The film 92 substantially defines the width of the second electrically conductive electrode 91 formed on the cap layer 93. Therefore, current is applied to the active layer 95 from the electrode 91 through the portion of width S which is narrower than the width W of the light emitting element.

By changing the substantial width of the electrode 91 through which current is applied to the active layer of the light emitting element, it becomes possible to control the width of the high luminous intensity portion, which makes it possible to obtain a desired luminous intensity ratio of the light from the end surface 914 with respect to the light from the side walls of the groove 98.

Besides, the density of current applied to the light emitting active layer 95 is increased, which heightens the efficiency of luminous emission so that a large optical output 911 can be obtained in the direction of the light emission axis 912 with a low amount of current applied.

As in the case of the first and second embodiment of the invention, mentioned before, in the event that the light emitting array device in accordance with the fourth embodiment mentioned above is used in conjunction with an appropriate optical system, the gap between the near field patterns of the adjacent light emitting elements becomes narrower than the width of the separating groove 98 and it becomes possible to control the optical intensity distribution of the output from the end surface 914 and the output from the side wall of the groove 98.

Further, as in the case of the third embodiment of the invention, the fourth embodiment can be arranged in such a way that the angle θ between the groove 98 and the end surface 914 satisfies the condition tan $\theta \leq L/a$ wherein letter (a) represents the width of the groove 98 in the end surface 914 and letter (L) represents the length of the element. Due to the arrangement, it becomes possible to obtain continuous near field patterns of the elements having a desired optical intensity distribution ratio between the light from the end surface 914 and the light from the side wall of the groove 98.

Figure 10:
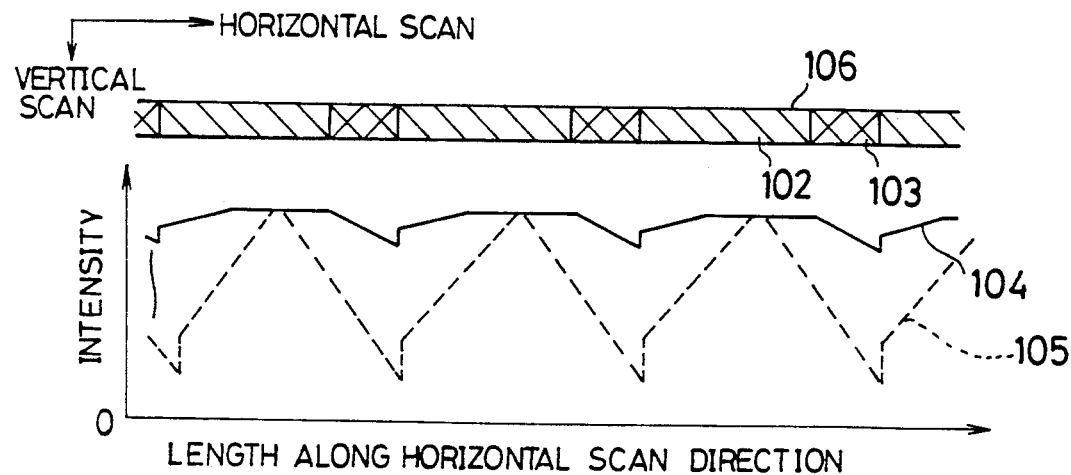
FIG. 10 is an explanatory view of the near field pattern image and the optical intensity distribution in accordance with the embodiment of FIGS. 9a and 9b.

FIG. 10 represents an example of the near field patterns obtained by the light emitting array device in accordance with the above-mentioned embodiment of the invention in which the condition tan $\theta \leq L/a$, mentioned above, is satisfied.

A near field pattern 103 of the side wall of the groove 98 is formed between every two adjacent near field patterns 102 of the light emitting end surface so that the entire width of the gap between the patterns 102 is covered with the pattern 103, forming a continuous near field pattern of the light emitting elements.

Also, by changing the width of the electrode 91 which is formed on the layer 93 and through which electrode current is applied to the active layer 95, it becomes possible to adjust the width of the high luminous intensity portion so that a desired intensity distribution can be obtained within a range from the optical intensity distribution 104 to the optical intensity distribution 105 illustrated in FIG. 10. This makes it possible to control the printing strength distribution when used in a printer.

In the event that the light emitting array device in accordance with the embodiment of the present invention is used as a light source of a printer, the gap between the adjacent dots is minimized or deleted in the horizontal scanning direction and it becomes possible to control the printing strength distribution, which remarkably upgrades the quality of the printing products.

Figure 11A:
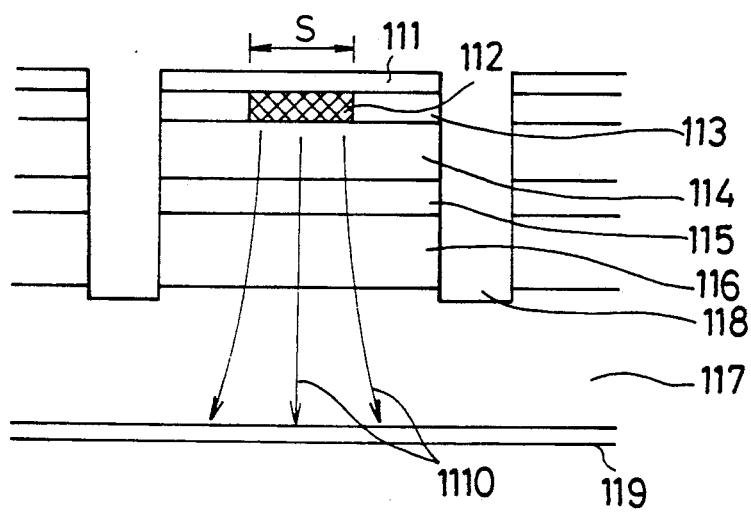
FIG. 11a is a front view of still another embodiment of the semiconductor light emitting array device in accordance with the present invention.
Figure 11B:
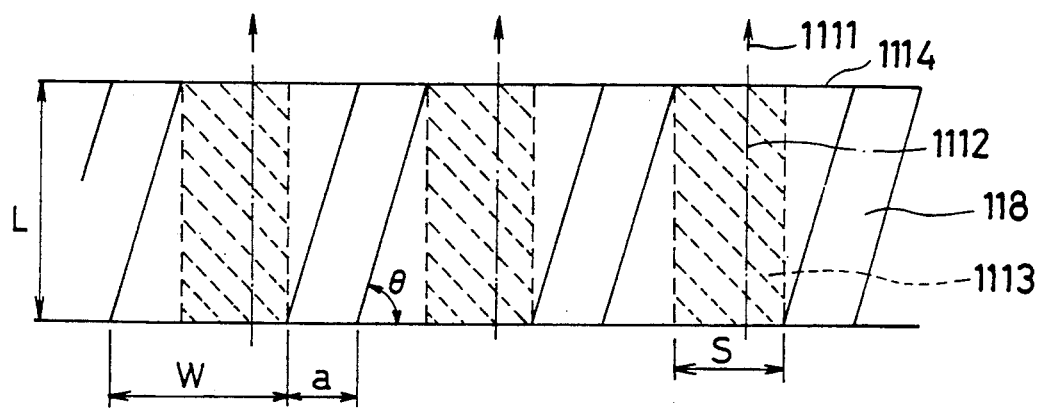

FIGS. 11a and 11b represent a fifth embodiment of the light emitting semiconductor array device in accordance with the present invention.

The array device comprises a layer-stacked structure including a first electrically conductive substrate 117, a first electrically conductive clad layer 116, a light emitting active layer 115, a second electrically conductive clad layer 114 and a first electrically conductive cap layer 113. In the layer 113, a second electrically conductive area 112 is formed. The width S of the area 112 is narrower than the width W of the light emitting element. The thickness of the area 112 is the same as that of the layer 113.

Separating grooves 118 are formed in the stacked structure from the surface thereof to the substrate 117 perpendicularly to the surface of the substrate 117 in a sectional plane of the stacked structure. In a plan view, each groove 118 is formed linearly from one side end of the stacked structure to the other side end thereof along a direction not parallel to the light emission axis 1112. The grooves 118 electrically isolate each light emitting element. The array device is an assembly of the isolated light emitting elements.

On each layer 113 is formed a second electrically conductive electrode 111. On the lower surface of the substrate 117 is formed a first electrically conductive electrode 119.

An optical output can be obtained from any desired light emitting element in the device by running a predetermined forward current between the electrodes 111 and 119 of the desired element.

In accordance with the structure of the embodiment mentioned above, only the area 112 formed in the layer 113 constitutes the current route for supplying current to the active layer 115. By changing the width of the area 112, thus changing the width of the current route for the active layer 115, it becomes possible to control the width of the high luminous intensity area, which, in turn, makes it possible to obtain a desired luminous intensity distribution ratio of the light from the end surface 1114 with respect to the light from the side wall of the groove 118.

Besides, in accordance with the above-mentioned embodiment, the density of current applied to the active layer 115 is increased so that the optical emission efficiency is heightened, which makes it possible to obtain a high optical output 1111 in the direction of light emission axis 1112 even when the amount of current applied is small.

In the event that the light emitting array device in accordance with the embodiment of the invention is used in conjunction with an appropriate optical system, as in the case of the fourth embodiment, it becomes possible to obtain near field patterns which are continuous between the light emitting elements and have a desired optical intensity distribution ratio between the optical output from the end surface 1114 and that from the groove 118. By applying such an array device to a light source of a printer, it becomes possible to obtain high quality printing products.

Figure 12A:
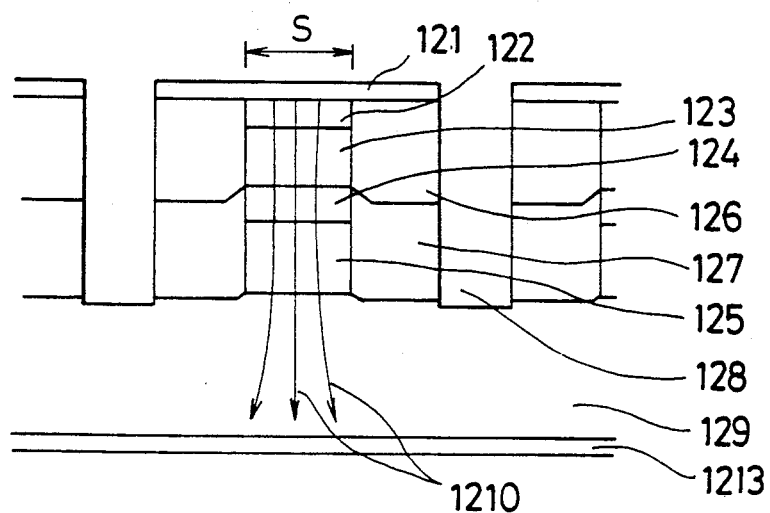
FIG. 12a is a front view of still another embodiment of the semiconductor light emitting array device in accordance with the present invention.
Figure 12B:
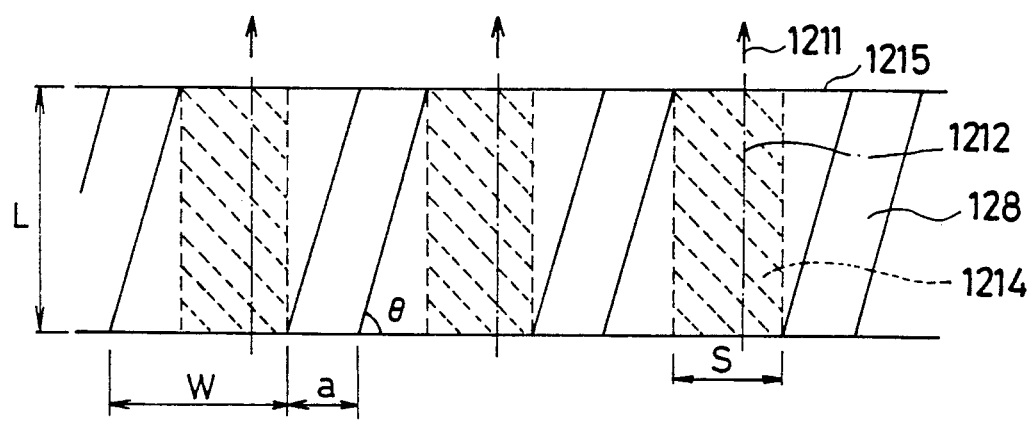

FIGS. 12a and 12b represent a sixth embodiment of the light emitting semiconductor array device in accordance with the present invention.

The array device comprises a layer-stacked structure including a first electrically conductive substrate 129, a first electrically conductive clad layer 125, a light emitting active layer 124, a second electrically conductive clad layer 123 and a second electrically conductive cap layer 122.

The stacked structure is buried in a first electrically conductive burying layer 126 and a second electrically conductive burying layer 127 disposed below the layer 126.

Separating grooves 128 are formed in the stacked burying layers 126 and 127 from the surface thereof to the substrate 129 perpendicularly to the surface of the substrate 129 in a sectional plane of the stacked structure. In a plan view, each groove 128 is formed linearly from one side end of the stacked structure to the other side end thereof along a direction not parallel to the light emission axis 1212. The grooves 128 electrically isolate each light emitting element. The array device is an assembly of the isolated light emitting elements.

On each layer 122 is formed a second electrically conductive electrode 121. On the lower surface of the substrate 129 is formed a first electrically conductive electrode 1213.

An optical output can be obtained from any desired light emitting element in the device by running a predetermined forward current between the electrodes 121 and 1213 of the desired element.

In accordance with the structure of the embodiment mentioned above, the burying layers are placed in a state of inverse bias, that is, equivalent to a high resistance area, when the element is activated, so that the current runs through the stacked portion other than the burying layers to the active layer 124. That is, only the stacked area other than the burying layers constitutes the current route for supplying current to the active layer 124. Therefore, by changing the width S of the stacked layers buried in the burying layers 126 and 127, as in the case of the fourth embodiment, it becomes possible to control the width of the high luminous intensity area, which, in turn, makes it possible to obtain a desired luminous intensity distribution ratio of the light from the end surface 1215 with respect to the light from the side wall of the groove 128.

Besides, in accordance with the abovementioned embodiment, the density of current applied to the active layer 124 is increased so that the optical emission efficiency is heightened, which makes it possible to obtain a high optical output in the direction of light emission axis 1212 even when the amount of current applied is small.

In the event that the light emitting array device in accordance with the embodiment of the invention is used in conjunction with an appropriate optical system, as in the case of the fourth embodiment, it becomes possible to obtain near field patterns which are continuous between the light emitting elements and have a desired optical intensity distribution ratio between the optical output from the end surface 1215 and that from the groove 128. By applying such an array device to a light source of a printer, it becomes possible to obtain high quality printing products.

It is to be noted that a high resistance layer may be used as the burying layer instead of the above-mentioned first electrically conductive burying layer 126 and second electrically conductive burying layer 127.

Figure 13A:
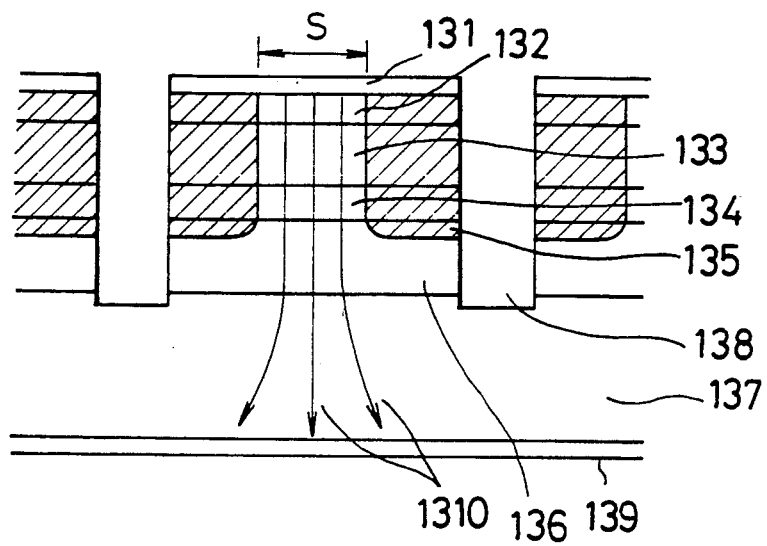
FIG. 13a is a front view of still another embodiment of the semiconductor light emitting array device in accordance with the present invention.
Figure 13B:
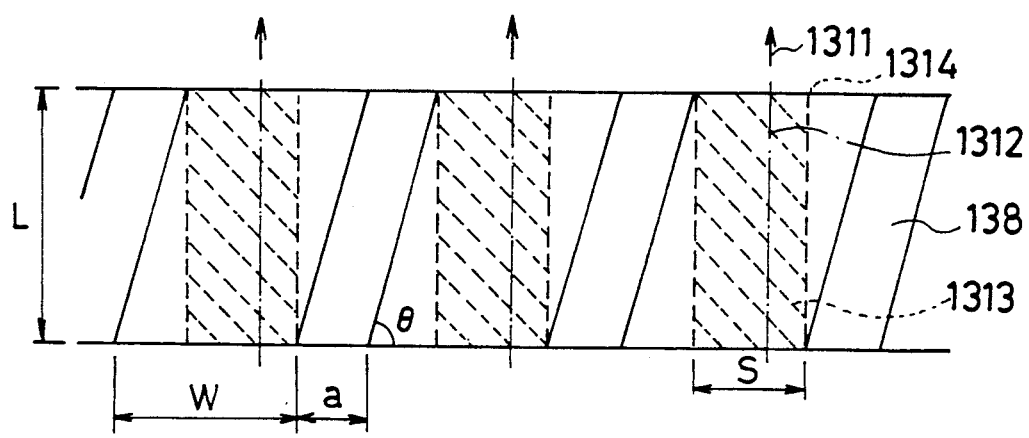

FIGS. 13*a* and 13*b* represents a seventh embodiment of the light emitting semiconductor array device in accordance with the present invention.

The array device comprises a layer-stacked structure including a first electrically conductive substrate 137, a first electrically conductive clad layer 136, a light emitting active layer 134, a second electrically conductive clad layer 133 and a second electrically conductive cap layer 132.

In the stacked structure, high resistance areas 135 are formed from the surface of the cap layer 132 to the clad layer 136 by implanting protons into the structure, defining a current route area of width S which is narrower than the width W of the light emitting element.

Separating grooves 138 are formed in the stacked structure from the surface thereof to the substrate 137 perpendicularly to the surface of the substrate 137 in a sectional plane of the stacked structure. In a plan view, each groove 138 is formed linearly from one side end of the stacked structure to the other side end thereof along a direction not parallel to the light emission axis 1312. The grooves 138 electrically isolate each light emitting element. The array device is an assembly of the isolated light emitting elements.

On each cap layer 132 is formed a second electrically conductive electrode 131. On the lower surface of the substrate 137 is formed a first electrically conductive electrode 139.

An optical output can be obtained from any desired light emitting element in the device by running a predetermined forward current between the electrodes 131 and 139 of the desired element.

In accordance with the structure of the embodiment mentioned above, only the stacked area other than the high resistance areas 135 constitutes the current route for supplying current to the active layer 134. Therefore, by changing the width S of the stacked structure constituting the current route, as in the case of the fourth embodiment, it becomes possible to control the width of the high luminous intensity area, which, in turn, makes it possible to obtain a desired luminous intensity distribution ratio of the light from the end surface 1314 with respect to the light from the side wall of the groove 138.

Besides, in accordance with the above-mentioned embodiment, the density of current applied to the active layer 134 is increased so that the optical emission efficiency is heightened, which makes it possible to obtain a high optical output in the direction of light emission axis 1312 even when the amount of current applied is small.

In the event that the light emitting array device in accordance with the embodiment of the invention is used in conjunction with an appropriate optical system, as in the case of the fourth embodiment, it becomes possible to obtain near field patterns which are continuous between the adjacent light emitting elements and have a desired optical intensity distribution ratio between the optical output from the end surface 1314 and that from the groove 138. By applying such an array device to a light source of a printer, it becomes possible to obtain high quality printing products.

Figure 14A:
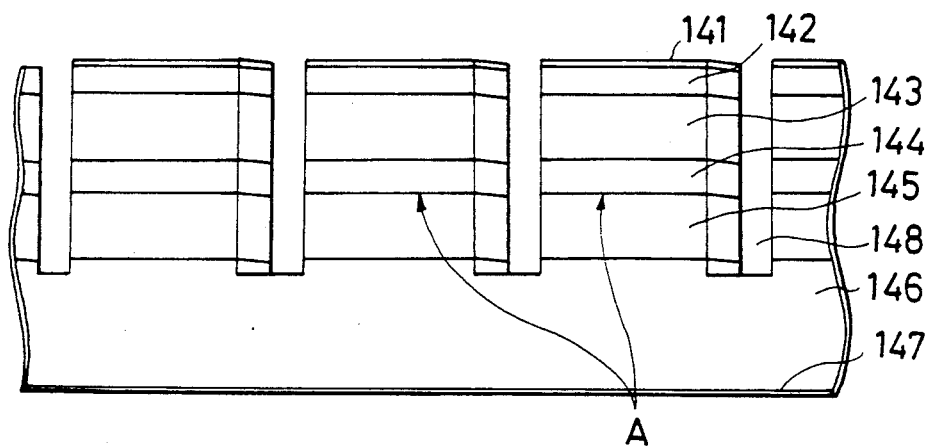
FIG. 14a is a front view of still another embodiment of the semiconductor light emitting array device in accordance with the present invention.
Figure 14B:
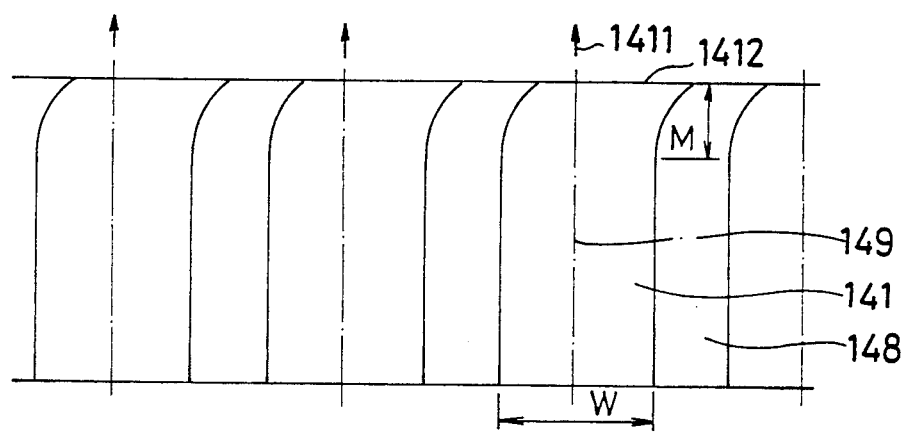

It is to be noted that the bottom of the area 135 formed by implanting protons may be in the substrate 137 or in any of the layers 136, 134 and 133. That is, it is possible to change the width of the current route irrespective of the depth of the high resistance area 135 as long as the area 135 is formed in the stacked structure. FIGS. 14*a* and 14*b* represent an eighth embodiment of the light emitting semiconductor array device in accordance with the present invention. FIG. 14*a* is a front view of the array device seen from the end surface of the light emitting side.

The stacked structure of this embodiment is similar to that of the first embodiment illustrated in FIGS. 3*a* and 3*b*. Separating grooves 148 are formed in the stacked structure from the surface thereof to the substrate 146 perpendicularly to the surface of the substrate 146. The grooves 148 electrically isolate each of the light emitting elements. The light emitting end surface 1412 of each element is formed perpendicular to the surface of the substrate 146. The array device is an assembly of the isolated light emitting elements.

On each cap layer 142, a second electrically conductive electrode 141 is formed. Also, on the lower surface of the substrate 146, a first electrically conductive electrode 147 is formed.

By running a predetermined forward current between the electrodes 141 and 147 of the desired light emitting element, an optical output can be obtained from a desired element in the array device. As illustrated in FIG. 14*b*, each groove 148 of the array device has a first portion which is formed in parallel to the light emission axis 149 and a second portion which is not formed in parallel to the axis 149. Also, the groove 148 is formed from one of the side surfaces of the stacked structure to the other side surface.

In accordance with the above-mentioned structure of the array device, due to the second portion of the groove 148 which is not parallel to the optical axis 149, the optical output in the direction of the axis 149 includes the light emitted from the side wall of the groove 148 in addition to the light emitted from the end surface 1412.

A near field pattern of the light from the side wall of each groove 148 is formed on the image surface in the event that the optical system for forming the image has a focal depth equal to or larger than the length M of the second portion of the groove 148 which portion is not parallel to the light emission axis 149. As a result, a near field pattern of the groove 148 is formed between every adjacent two near field patterns of the end surfaces 1412 so that the gap between the near field patterns of the adjacent light emitting elements becomes smaller than the width of the groove 148.

Besides, each groove 148 has the first portion which is parallel to the optical emission axis 149 in addition to the second portion which is not parallel to the axis 149. This results in that a long active layer 144 is formed in the direction of the axis 149 so that a large optical output 1411 can be obtained in the direction of the axis 149.

In the event that the light emitting array device in accordance with the embodiment mentioned above is used in conjunction with an appropriate optical system for forming images, it becomes possible to reduce the gap between the adjacent near field patterns of the light emitting elements less than the width of the groove 148 and obtain an optical output of large luminous intensity in the direction of the light emission axis 149.

Figure 15:
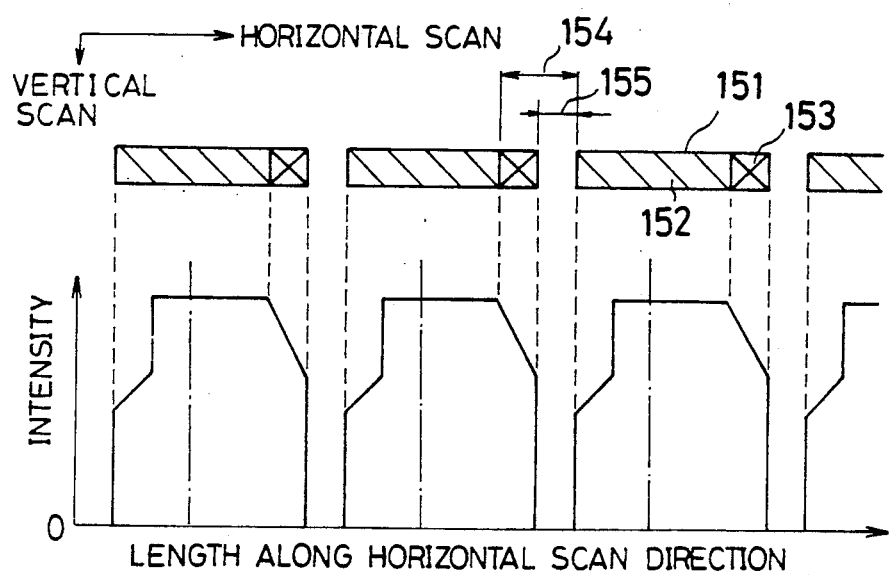
FIG. 15 is an explanatory view of the near field pattern image and the optical intensity distribution in accordance with the embodiment of FIGS. 14a and 14b.

FIG. 15 represents an example of the optical intensity distribution and the near field pattern images of the light emitting array device in accordance with the above mentioned embodiment of the present invention. In the event that the light emitting array device having such an optical output and the near field patterns as illustrated in FIG.15 is used as a light source of a printer, it becomes possible to easily reduce the gap between the dots along the horizontal scanning line so that the printing quality is remarkably heightened. Also, it becomes possible to obtain a large optical output so that the speed of printing is heightened.

Figure 16A:
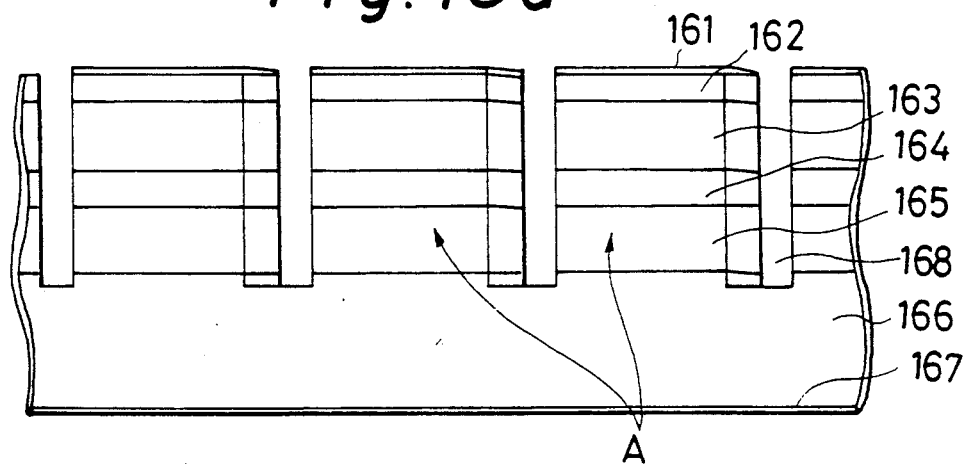
FIG. 16a is a front view of still another embodiment of the semiconductor light emitting array device in accordance with the present invention.
Figure 16B:
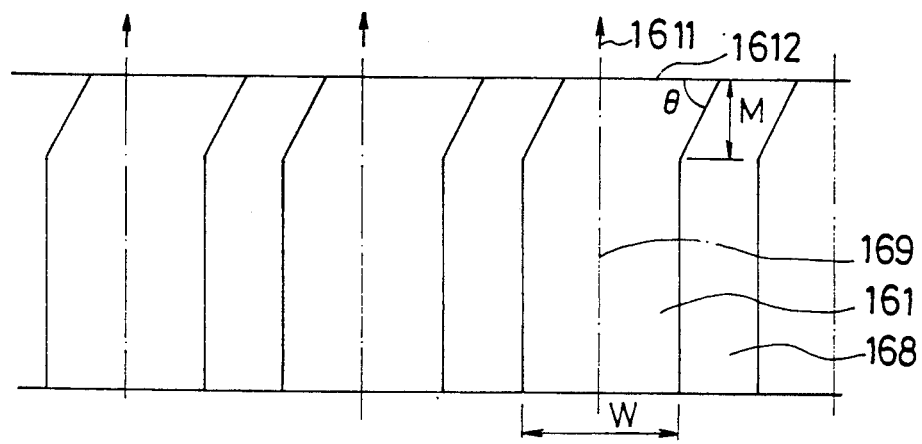

FIGS. 16a and 16b represent a ninthh embodiment of the light emitting semiconductor array device in accordance with the present invention. FIG. 16a is a front view of the array device seen from the end surface of the light emitting side.

The stacked structure of this embodiment is similar to that of the eighth embodiment illustrated in FIGS. 14a and 14b. Separating grooves 168 are formed in the stacked structure from the surface thereof, that is, the surface of the cap layer 162, to the substrate 166 perpendicularly to the surface of the substrate 166. The grooves 168 electrically isolate each of the light emitting elements. THe light emitting end surface 1612 of each element is formed perpendicular to the surface of the substrate 166. The array device is an assembly of the isolated light emitting elements.

on each cap layer 162, a second electrically conductive electrode 161 is formed. Also, on the lower surface of the substrate 166, a first electrically conductive electrode 167 is formed.

By running a predetermined forward current between the electrodes 161 and 167 of the desired light emitting element, an optical output can be obtained from a desired element in the array device.

As illustrated in FIG. 16b, each groove 168 of the array device has a first linear portion which is formed in parallel to the light emission axis 169 and a second linear portion which is not formed in parallel to the axis 169, that is, in the direction of angle $\theta$ other than 90 degrees with respect ot the light emission end surface 1612, i.e., in the direction not perpendicular to the end surface 1612. Also, the groove 168 is formed from one of the side surfaces of the stacked structure to the other side surface.

In accordance with the above-mentioned structure of the array device, due to the second portion of the groove 168 which is not parallel to the optical axis 169, the optical output 1611 in the direction of the axis 169 includes the light emitted from the side wall of the groove 168 in addition to the light emitted from the end surface 1612.

A near field pattern of the light from the side wall of each groove 168 is formed on the image surface in the event that the optical system for forming the image has a focal depth equal to or larger than the length M of the second portion of the groove 168 which portion is not parallel to the light emission axis 169. As a result, a near field pattern of the groove 168 is formed between every adjacent two near field patterns of the end surfaces 1612 so that the gap between the near field patterns of the adjacent light emitting elements becomes smaller than the width of the groove 168.

Also, in accordance with this ninth embodiment, each groove 168 has the inclined second portion which is formed linearly. Therefore, by changing the angle $\theta$ of the second portion with respect to the end surface 1612, it becomes possible to accurately and reproducibly control the width of the near field pattern of the side wall of the groove 168 so as to desirably reduce the gap between the near field patterns of the adjacent light emitting elements.

Besides, each groove 168 has the first portion which is parallel to the optical emission axis 169 in addition to the second portion which is not parallel to the axis 169. This results in that a long active layer 164 is formed in the direction of the axis 169 so that a large optical output 1611 can be obtained in the direction of the axis 169.

Figure 17:
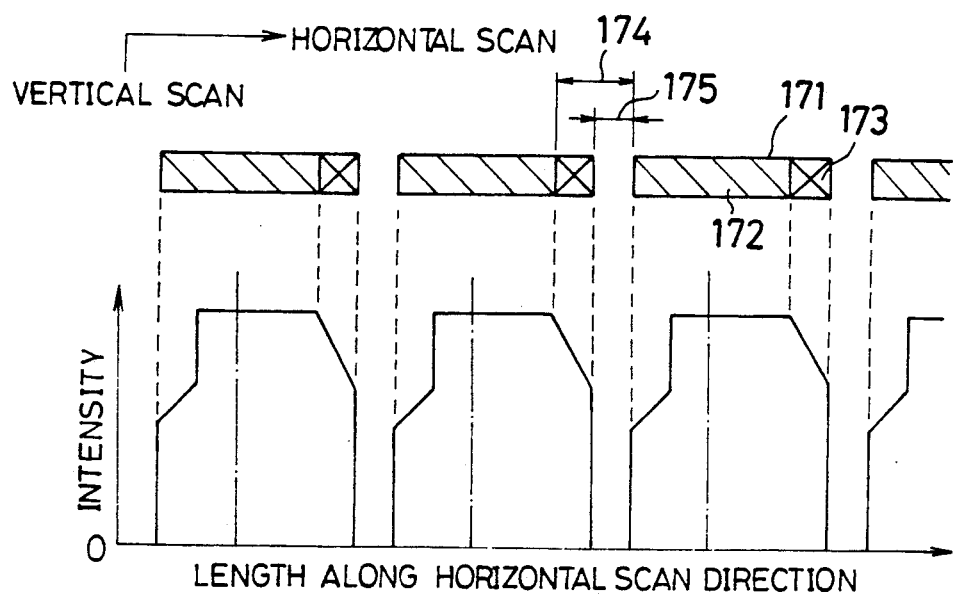
FIG. 17 is an explanatory view of the near field pattern image and the optical intensity distribution in accordance with the embodiment of FIGS. 16a and 16b.

In the event that the light emitting array device in accordance with the embodiment mentioned above is used in conjunction with an appropriate optical system for forming images, it becomes possible to reduce the gap between the adjacent near field patterns of the light emitting elements less than the width of the groove 168, as illustrated in FIG. 17, and obtain an optical output 1611 of large luminous intensity in the direction of the light emission axis 169.

FIG. 17 represents an example of the optical intensity distribution and the near field pattern images of the light emitting array device in accordance with the above mentioned embodiment of the present invention. Near field patterns 171 of the light emitted from the device are made up of near field pattern 172 of the light emitting end surface 1612 and the near field patterns 173 of the side wall of the groove 168. Accordingly, the gap 175 between the near field patterns of the adjacent light emitting elements becomes smaller than the width 174 of the groove 168. In the event that the light emitting array device having such an optical output and the near field patterns as illustrated in FIG. 17 is used as a light source of a printer, it becomes possible to easily reduce the gap between the dots along the horizontal scanning line so that the printing quality is remarkably heightened. Also, it becomes possible to obtain a large optical output so that the speed of printing is heightened.

Figure 18A:
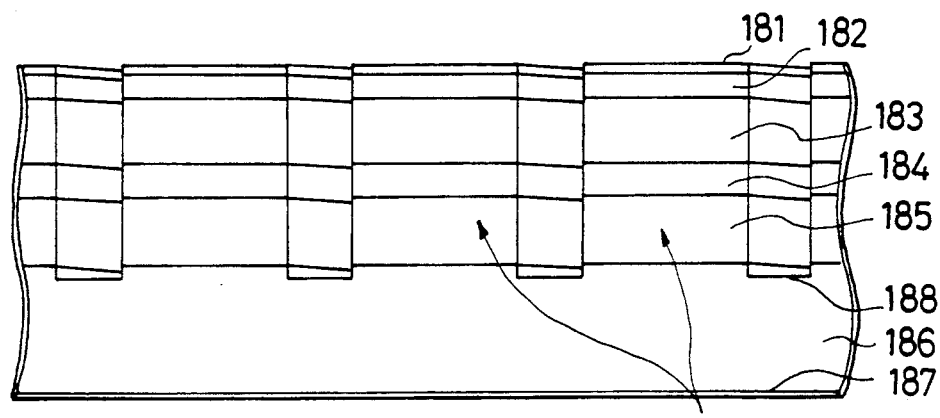
FIG. 18a is a front view of still another embodiment of the semiconductor light emitting array device in accordance with the present invention.
Figure 18B:
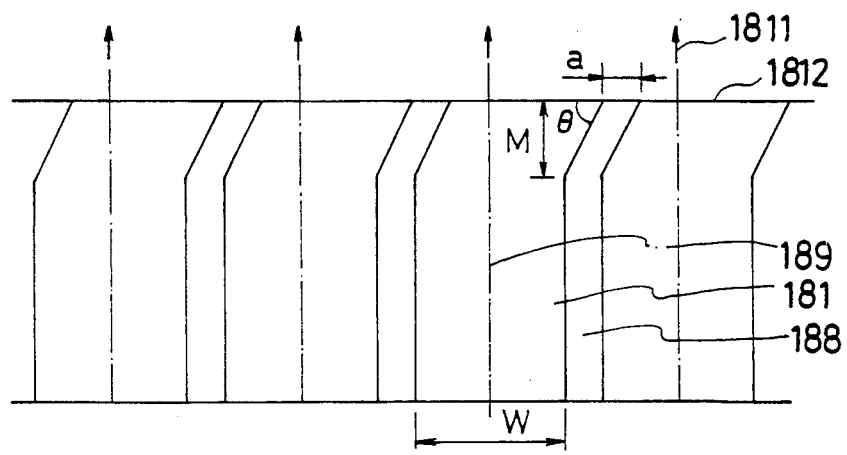

FIGS. 18a and 18b represent a tenth embodiment of the light emitting semiconductor array device in accordance with the present invention. FIG. 18a is a front view of the array device seen from the end surface of the light emitting side. Also, FIG. 18b is a plan view of the array device representing the layout of the separating grooves 188 formed on the substrate 186.

The stacked structure of this embodiment is similar to that of the ninth embodiment illustrated in FIGS. 16a and 16b. Separating grooves 188 are formed in the stacked structure from the surface thereof, that is, the surface of the cap layer 182, to the substrate 186 perependicularly to the surface of the substrate 186. The grooves 188 electrically isolate each of the light emitting elements. The light emitting end surface 1812 of each element is formed perpendicular to the surface of the substrate 186. The array device is an assembly of the isolated light emitting elements.

On each cap layer 182, a second electrically conductive electrode 181 is formed. Also, on the lower surface of the substrate 186, a first electrically conductive electrode 187 is formed.

By running a predetermined forward current between the electrodes 181 and 187 of the desired light emitting element, an optical output can be obtained from a desired element in the array device.

As illustrated in FIG. 18b, each groove 188 of the array device has a first linear portion which is formed in parallel to the light emission axis 189 and a second linear portion which is not formed in parallel to the axis 189, that is, in the direction of angle $\theta$ other than 90 degrees with respect to the light emission end surface 1812, i.e., in the direction not perpendicular to the end surface 1812. Also, the inclined second portion of the groove 188 satisfies the condition $\tan\theta \leq M/a$ wherein letter (M) represents the length of the second portion of the groove 188 measured in the direction of light emitting axis 189 in plan view and letter (a) represents the width of the groove 188 in the end surface 1812. Also, the groove 188 is formed from one of the side surfaces of the stacked structure to the other side surface.

In accordance with the above-mentioned structure of the array device, due to the second portion of the groove 188 which is not parallel to the optical axis 189, the optical output 1811 in the direction of the axis 189 includes the light emitted from the side wall of the groove 188 in addition to the light emitted from the end surface 1812.

Figure 19:
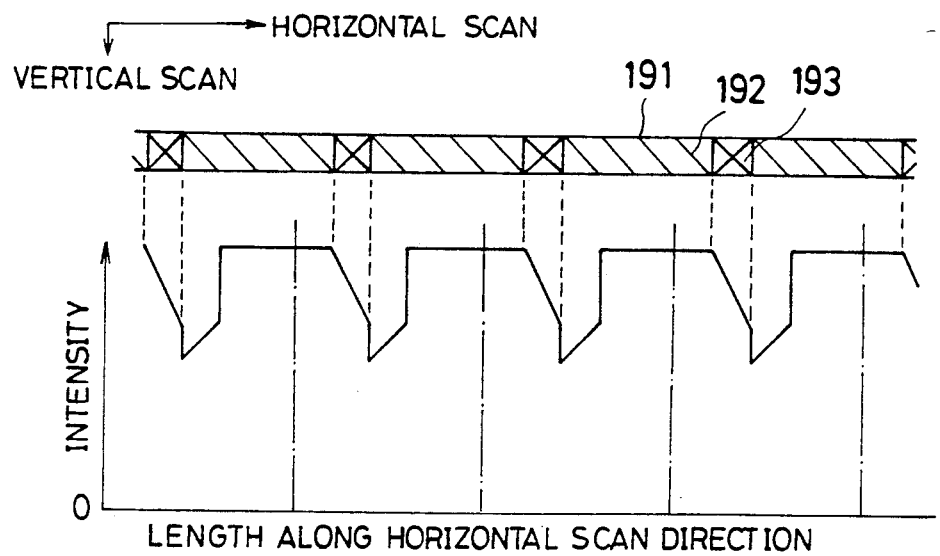
FIG. 19 is an explanatory view of the near field pattern image and the optical intensity distribution in accordance with the embodiment of FIGS. 18a and 18b.

Also, due to the arrangement in which the condition $\tan\theta \leq M/a$ is satisfied, in the event that an optical system for forming images which has a focal depth equal to or larger than M, the entire gap between the near field patterns of the adjacent light emitting elements is covered with the pattern image of the groove side wall, as illustrated in FIG. 19. Therefore, a continuous near field pattern image can be obtained in the horizontal scanning direction, that is, in the direction of the arrangement of the light emitting element row.

Besides, each groove 188 has the first portion which is parallel to the optical emission axis 189 in addition to the second portion which is not parallel to the axis 189. This results in that a long active layer 184 is formed in the direction of the axis 189 so that a large optical output 1811 can be obtained in the direction of the axis 189.

In the event that the light emitting array device in accordance with the embodiment mentioned above is used in conjunction with an appropriate optical system for forming images, it becomes possible to reduce the gap between the adjacent near field patterns of the light emitting elements less than the width of the groove 188, as illustrated in FIG. 19, and obtain an optical output 1811 of large luminous intensity in the direction of the light emission axis 189.

FIG. 19 represents an example of the optical intensity distribution and the near field pattern images of the light emitting array device in accordance with the above mentioned embodiment of the present invention. In the event that the light emitting array device having the above-mentioned structure is used in conjunction with an optical system having a focal depth larger than the length M of the portion of groove 188 not parallel to the axis 189, the near field pattern 191 is formed so that the gap between adjacent two near field patterns 192 of the light emitting surface 1812 is filled with the near field pattern 193 of the groove side wall. Therefore, the near field patterns 191 of the light emitting elements become continuous. In the event that the light emitting array device having such an optical output and the near field patterns as illustrated in FIG. 19 is used as a light source of a printer, it becomes possible to completely scan along the line not only in the vertical scanning direction but also in the horizontal scanning direction as well so that the printing quality is remarkably heightened. Also, it becomes possible to obtain a large optical output so that the speed of printing is heightened.

The light emitting material used in each of the above-mentioned embodiments of the array device in accordance with the present invention may comprise a semiconductor compound of III-V group such as GaAs, AlGaAs, AlGaInP, InP, InGaAsP, InGaP, InAlP, GaAsP, GaN, InAs, InAsP, InAsSb, etc., a semiconductor comound of II-IV group such as ZnSe, ZnS, ZnSSe, CdS, CdSe, CdSSe, CdTe, HgCdTe, etc. or a semiconductor compound of IV-VI group such as PbSe, PbTe, PbSnTe, PbSnTe, etc. An appropriate semiconductor material can be selected from the above mentioned examples considering the advantageous points of the respective material.

For example, the first embodiment of the present invention may be constituted from a double-hetero structure comprising a first electrically conductive substrate made from n-GaAs, a first electrically conductive clad layer made from n-AlGaAs, an active layer made from GaAs, a second electrically conductive clad layer made from p-AlGaAs and a cap layer made from p-GaAs. The material of the active layer is determined considering the wavelength of the optical output. Also, the material of the clad layer is determined so that the energy gap thereof is larger than that of the active layer.

A single-hetero structro or a homo-junction structure may be adopted instead of the double-hetero structure as the layer-stacked structure of the array device in accordance with the present invention.

Also, the separating groove of each embodiment of the invention mentioned above is formed from the surface of the stacked structure to the substrate. However, it is sufficient that the groove isolates electrically the active layers of the adjacent light emitting elements. Therefore, it is not necessary that the groove is formed to reach the substrate. It is sufficient that the groove is formed to reach the first electrically conductive clad layer through the active layer.

Such grooves may be formed by etching, for example. It is desirable to adopt a dry etching process which is highly anisotropic from the view piont that the side surface of the groove is preferably perpendicular to the substrate surface for the functional reason of the device.

Also, with regard to the current route portion for supplying current to the active layer of from fourth to seventh embodiments, the current route is not necessarily parallel to the light emission axis in plan view. The width and direction of the current route portion are not limited to those of the embodiments. Also, the sectional structure of the stacked array device for limiting the width of the current route less than the width of the light emitting element is not limited to that of the above-mentioned embodiments. Any appropriate structure may be adopted as long as the same function can be performed.

It is to be noted that each of the fourth to seventh embodiments can be combined with the structure of from the first to third embodiments and from the eighth to tenth embodiments.

Many widely different embodiments of the present invention may be constructed without departing from the spirit and scope of the present invention. It should be understood that the present invention is not limited to the specific embodiments described in the specification, except as defined in the appended claims.

What is claimed is:

1. A semiconductor light emitting array device comprising:
    a substrate having an upper surface and a lower surface;
    a plurality of light emitting elements formed on said substrate in a row and isolated from each other by a separation groove, each of said light emitting elements emitting light from a side end surface thereof in a direction parallel to said upper substrate surface and said groove having a portion formed in a direction other than in parallel to said direction of light, each of said light emitting elements being constituted from a stacked layer structure comprising:
        a first clad layer formed on said upper surface of said substrate;
        a light emitting active layer formed on said first clad layer;
        a second clad layer formed on said active layer;
        a cap layer formed on said second clad layer; and
        an insulating film formed on said cap layer, said film having an opening spanning from said side end surface to an opposite side end surface and having a width narrower than that of said element, said opening defining a current route area through which current is supplied to said active layer.

2. A semiconductor light emitting array device according to claim 1, wherein a first electrode is formed on said lower surface of said substrate and a second electrode is formed on said cap layer of each light emitting element.

3. A semiconductor light emitting array device according to claim 1, wherein said groove is formed in a circular arc shape.

4. A semiconductor light emitting array device according to claim 1, wherein said groove is formed linearly from said side end surface of said element to said opposite side end surface inclining by an angle $\theta$ with respect to said side end surface, wherein siad angle $\theta$ is other than 90 degrees.

5. A semiconductor light emitting array device according to claim 4, wherein a condition $\tan\theta \leq L/a$ is satisfied, L representing a length of said element and letter a representing a width of said groove.

6. A semiconductor light emitting array device according to claim 4, wherein said groove has a first portion which is parallel to said direction of light and a second portion which is continuous from said first portion and formed in a circular arc shape.

7. A semiconductor light emitting array device according to claim 1, wherein said groove has a first portion which is parallel to said direction of light and a second portion which is continuous from said first portion and formed linearly inclining by an angle $\theta$ with respect to said side end surface, said angle $\theta$ being other than 90 degrees.

8. A semiconductor light emitting array device according to claim 7, wherein a condition $\tan\theta \leq M/a$ is satisfied, M representing a length of said second portion measured in said direction of light and letter a representing a width of said groove.

9. A semiconductor light emitting array device comprising:
    a substrate having an upper surface and a lower surface;
    a plurality of light emitting elements formed on said substrate in a row and isolated from each other by a separation groove, each of said light emitting elements emitting light from a side end surface thereof in a direction parallel to said upper substrate surface and said groove having a portion formed in a direction other than in parallel to said direction of light, each of said light emitting elements being constituted from a stacked layer structure comprising:
        a first clad layer formed on said upper surface of said substrate;
        a light emitting active layer formed on said first clad layer;
        a second clad layer formed on said active layer;
        a cap layer formed on said second clad layer; and
        an electrically conductive film buried in said cap layer spanning from said side end surface to an opposite side end surface, said film having a thickness equal to that of said cap layer and a width narrower than that of said element, and defining a current route area through which current is supplied to said active layer.

10. A semiconductor light emitting array device according to claim 9, wherein in a first electrode is formed on said lower surface of said substrate and a second electrode is formed on said cap layer of each light emitting element.

11. A semiconductor light emitting array device according to claim 9, wherein said groove is formed in a circular arc shape.

12. A semiconductor light emitting array device according to claim 9, wherein said groove is formed linearly from said side end surface of said element to said opposite side end surface inclining by an angle $\theta$ with respect to said side end surface, wherein said angle $\theta$ is other than 90 degrees.

13. A semiconductor light emitting array device according to claim 12, wherein a condition $\tan\theta \leq L/a$ is satisfied, L representing a length of said element and letter a representing a width of said groove.

14. A semiconductor light emitting array device according to claim 9, wherein said groove has a first portion which is parallel to said direction of light and a second portion which is continuous from said first portion and formed in a circular arc shape.

15. A semiconductor light emitting array device according to claim 9, wherein said groove has a first portion which is parallel to said direction of light and a second portion which is continuous from said first portion and formed linearly inclining by an angle $\theta$ with respect to said side end surface, said angle $\theta$ being other than 90 degrees.

16. A semiconductor light emitting array device according to claim 15, wherein a condition $\tan\theta \leq M/a$ is satisfied, M representing a length of said second portion measured in said direction of light and letter a representing a width of said groove.

17. A semiconductor light emitting array device comprising:
    a substrate having an upper surface and a lower surface;

a plurality of light emitting elements formed on said substrate in a row and isolated from each other by a separation groove through a burying layer in which each of said emitting elements is buried, each of said light emitting elements emitting light from a side end surface thereof in a direction parallel to said upper substrate surface and said groove having a portion formed in a direction other than in parallel to said direction of light, each of said light emitting elements being constituted from a stacked layer structure comprising:
  a first clad layer formed on said upper surface of said substrate;
  a light emitting active layer formed on said first clad layer;
  a second clad layer formed on said active layer; and
  a cap layer formed on said second clad layer; and
  said burying layer having a resistance higher than that of a current route area of said stacked layer structure, said current route area allowing current to be supplied to said active layer.

18. A semiconductor light emitting array device according to claim 17, wherein a first electrode is formed on said lower surface of said substrate and a second electrode is formed on said cap layer of each light emitting element.

19. A semiconductor light emitting array device according to claim 17, wherein said groove is formed in a circular arc shape.

20. A semiconductor light emitting array device according to claim 17, wherein said groove is formed linearly from said side end surface of said element to said opposite side end surface inclining by an angle $\theta$ with respect to said side end surface, wherein said angle $\theta$ is other than 90 degrees.

21. A semiconductor light emitting array device according to claim 20, wherein a condition $\tan\theta \leq L/a$ is satisfied, L representing a length of said element and letter a representing a width of said groove.

22. A semiconductor light emitting array device according to claim 17, wherein said groove has a first portion which is parallel to said direction of light and a second portion which is continuous from said first portion and formed in a circular arc shape.

23. A semiconductor light emitting array device according to claim 17, wherein said groove has a first portion which is parallel to said direction of light and a second portion which is continuous from said first portion and formed linearly inclining by an angle $\theta$ with respect to said side end surface, said angle $\theta$ being other than 90 degrees.

24. A semiconductor light emitting array device according to claim 23, wherein a condition $\tan\theta \leq M/a$ is satisfied, M representing a length of said second portion measured in said direction of light and letter a representing a width of said groove.

25. A semiconductor light emitting array device comprising:
  a substrate having an upper surface and a lower surface;
  a plurality of light emitting elements formed on said substrate in a row and isolated from each other by a separation groove, each of said light emitting elements emitting light from a side end surface thereof in a direction parallel to said upper substrate surface and said groove having a portion formed in a direction other than in parallel to said direction of light, each of said light emitting elements being constituted from a stacked layer structure comprising:
    a first clad layer formed on said upper surface of said substrate;
    a light emitting active layer formed on said first clad layer;
    a second clad layer formed on said active layer; and
    a cap layer formed on said second clad layer; and
  each of said light emitting elements having a region extending from said cap layer to said first clad layer and spanning from said side end surface to an opposite side end surface, in which impurities are implanted, and a current route area excluding said region for running current through said element to supply current to said active layer, said region having a resistance higher than that of said current route area.

26. A semiconductor light emitting array device according to claim 25, wherein a first electrode is formed on said lower surface of said substrate and a second electrode is formed on said cap layer of each light emitting element.

27. A semiconductor light emitting array device according to claim 25, wherein said groove is formed in a circular arc shape.

28. A semiconductor light emitting array device according to claim 25, wherein said groove is formed linearly from said side end surface of said element to said opposite side end surface inclining by an angle $\theta$ with respect to said side end surface, wherein said angle $\theta$ is other than 90 degrees.

29. A semiconductor light emitting array device according to claim 28, wherein a condition $\tan\theta \leq L/a$ is satisfied, letter L representing a length of said element and letter a representing a width of said groove.

30. A semiconductor light emitting array device according to claim 25, wherein said groove has a first portion which is parallel to said direction of light and a second portion which is continuous from said first portion and formed in a circular arc shape.

31. A semiconductor light emitting array device according to claim 25, wherein said groove has a first portion which is parallel to said direction of light and a second portion which is continuous from said first portion and formed linearly inclining by an angle $\theta$ with respect to said side end surface, said angle $\theta$ being other than 90 degrees.

32. A semiconductor light emitting array device according to claim 31, wherein a condition $\tan\theta \leq M/a$ is satisfied, M representing a length of said second portion measured in said direction of light and letter a representing a width of said groove.

* * * * *